(12) United States Patent
Komiyama et al.

(10) Patent No.: US 9,400,289 B2
(45) Date of Patent: Jul. 26, 2016

(54) CLAMP SENSOR AND MEASUREMENT APPARATUS

(71) Applicant: HIOKI DENKI KABUSHIKI KAISHA, Nagano (JP)

(72) Inventors: Tetsuya Komiyama, Nagano (JP); Hideo Watanabe, Nagano (JP)

(73) Assignee: HIOKI DENKI KABUSHIKI KAISHA, Nagano (JP)

( * ) Notice: Subject to any disclaimer, the term of this patent is extended or adjusted under 35 U.S.C. 154(b) by 23 days.

(21) Appl. No.: 14/660,212

(22) Filed: Mar. 17, 2015

(65) Prior Publication Data

US 2015/0276802 A1 Oct. 1, 2015

(30) Foreign Application Priority Data

Mar. 27, 2014 (JP) .................... 2014-066402

(51) Int. Cl.
*G09G 5/00* (2006.01)
*G01R 31/02* (2006.01)
*G01R 1/04* (2006.01)
*G01R 1/22* (2006.01)

(52) U.S. Cl.
CPC ............ *G01R 1/0425* (2013.01); *G01R 1/22* (2013.01)

(58) Field of Classification Search
CPC ........... G01R 19/0092; G01R 19/2513; G01R 21/06; G01R 15/26; G01R 19/0046; G01R 19/15; G01R 19/16519; G01R 19/25; G01R 19/175; G01R 19/257; G01R 27/26; G01R 27/2605; G01D 5/24; G01D 5/241; G01D 5/2412; G01D 5/2417; G06K 9/0002; H03K 17/955; H03K 2217/960725; G06F 3/0414; G06F 2203/04103; G01L 1/146
USPC ....... 324/126, 127, 133, 156, 142, 99 D, 115, 324/121 R, 96, 519, 644, 658, 661, 662, 324/663, 671, 686, 691, 693, 699, 713, 715, 324/716, 750.17, 76.11; 439/725–729
See application file for complete search history.

(56) References Cited

U.S. PATENT DOCUMENTS

2005/0184722 A1* 8/2005 Gregorec .............. G01R 1/22
324/126

FOREIGN PATENT DOCUMENTS

JP 2006-184246 7/2006
JP 2006184246 A * 7/2006 ............. G01R 31/02

* cited by examiner

*Primary Examiner* — Patrick Assouad
*Assistant Examiner* — Taqi Nasir
(74) *Attorney, Agent, or Firm* — Greenblum & Bernstein, P.L.C.

(57) ABSTRACT

A clamp sensor detects a detected value for a clamped object and includes: a main body with two main surfaces and two side surfaces; first and second clamp units whose front ends can open and close and form a ring-shaped body surrounding the clamped object; and an opening/closing mechanism for the clamp units. The first clamp unit is fixed to the main body at one side surface. The second clamp unit has a base end rotatably supported by a support shaft disposed toward the other side surface. The opening/closing mechanism includes: a biasing member biasing the second clamp unit to open the clamp units; and a sliding portion disposed on the other side surface and capable of sliding along the length of the main body. When slid toward the clamp units, the sliding portion presses the second clamp unit to close the front ends.

8 Claims, 4 Drawing Sheets

F I G. 1
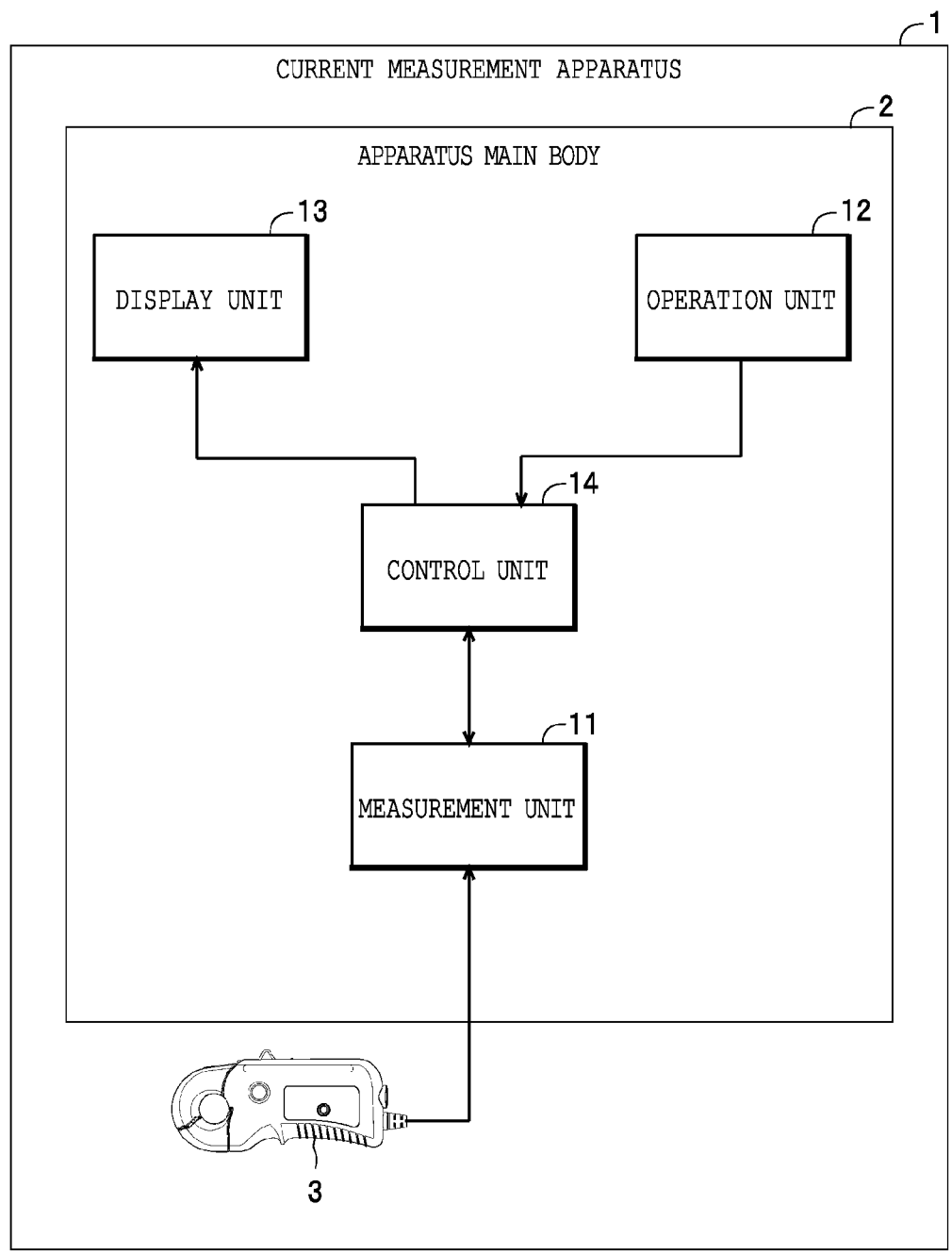

CLAMP SENSOR AND MEASUREMENT APPARATUS

FIELD OF THE INVENTION

The present invention relates to a clamp sensor equipped with a pair of clamp units and a measurement apparatus equipped with such clamp sensor.

DESCRIPTION OF THE RELATED ART

A wiring path detecting receiver (hereinafter simply "receiver") disclosed in Japanese Laid-Open Patent Publication No. 2006-184246 is known as one example of a clamp sensor of this type. Such receiver is constructed of a case and a clamp sensor that is composed of two sensor structures and is enclosed in the case. With this receiver, by performing a sliding operation on an operation knob of a moving body disposed on the front surface of the case, it is possible to move the clamp sensor in and out of the case. The receiver is constructed so that in a state where the clamp sensor is protruding from the case, the front ends of the sensor structures are open, and in a state where the clamp sensor is housed inside the case, the front ends of the sensor structures are closed. With this receiver, when a wire on which a current is flowing has been clamped by the clamp sensor (i.e., the sensor structures), it is possible, using the clamp sensor, to detect a magnetic field produced by the wire due to the current flowing through the wire.

SUMMARY OF THE INVENTION

However, by investigating the receiver described above, the inventors of the present application discovered the following problem to be solved. With the above receiver, when clamping a wire using the clamp sensor (i.e., the two sensor structures), it is necessary to move the sensor structures out of the case to open the front ends of the sensor structures, to pass the wire through the gap between the front ends to place the wire inside the sensor structures, and to then slide the operation knob to close the front end portions while housing the sensor structures within a housing portion. That is, with this receiver, the positions of the sensor structures change when the front ends of the sensor structures are closed (i.e., the sensor structures move relative to the wire). This means that when clamping a wire with this receiver, it is necessary to move the entire receiver while performing the sliding operation of the operation knob so that the wire does not move outside the sensor structures from the gap between the front ends of the sensor structures, resulting in the problem that the receiver is difficult to operate.

The present invention was conceived in view of the problem described above and has a principal object of providing a clamp sensor and measurement apparatus with improved operability when clamping an object to be clamped.

To achieve the stated object, a clamp sensor according to the present invention comprises: a main body unit having a pair of main surfaces that oppose one another and a pair of side surfaces that oppose one another; a first clamp unit and a second clamp unit which are constructed so that respective front end portions thereof are capable of opening and closing, which form, in a state where the front end portions are closed, a ring-shaped body that surrounds an object to be clamped, and which are provided at one end portion of the main body unit so that a plane of an opening of the ring-shaped body is parallel to the respective main surfaces; and an opening/closing mechanism that opens and closes the respective front end portions of the first and second clamp units, wherein the clamp sensor is configured so as to be capable of detecting a detected value for the object to be clamped, the first clamp unit is fixed at the one end portion of the main body unit on a side of one side surface out of the side surfaces, the second clamp unit has a base end portion axially supported by a support shaft provided so as to intersect the respective main surfaces and is rotatably disposed at the one end portion of the main body unit on a side of other side surface out of the side surfaces with the support shaft as a center of rotation, and the opening/closing mechanism includes:

a biasing member that biases the second clamp unit in a direction where the respective front end portions of the first and second clamp units open; and a sliding portion which is disposed on a side of the other side surface so as to be capable of sliding along a length direction of the main body unit that joins the other end portion and the one end portion of the main body unit and which contacts, when slid toward the one end portion of the main body unit, a contacted portion of an outer circumferential surface of the second clamp unit to rotate the second clamp unit in a direction where the respective front end portions of the first and second clamp units close.

Also, in the measurement apparatus according to the present invention, the clamp sensor described above and a measurement unit measuring a measured value for the object to be clamped based on the detected value detected by the clamp sensor.

With the clamp sensor and the measurement apparatus, the first clamp unit is fixed to the one end portion of the main body unit and the second clamp unit is rotatably disposed on the one end portion of the main body unit, and when the sliding portion has been slid toward the one end portion of the main body unit, the front end portion of the sliding portion contacts the outer circumferential surface of the second clamp unit to rotate the second clamp unit in a direction where the front end portions of the first and second clamp units close. This means that with the clamp sensor and the measurement apparatus, since it is possible to carry out a closing operation in a state where the first and second clamp units do not move relative to the main body unit, unlike a conventional configuration where the first and second clamp units move relative to the main body unit as part of a closing operation, when carrying out a closing operation, it is not necessary to carry out an operation such as adjusting the position of the clamp sensor relative to the object to be clamped to prevent the object to be clamped from coming out from the first and second clamp units, resulting in a sufficient improvement in operability. Also, with the clamp sensor and the measurement apparatus, the force that slides the sliding portion acts upon the outer circumferential surface of the second clamp unit to rotate the second clamp unit, and by doing so it is possible to place the first and second clamp units in the closed state. This means that with the clamp sensor and the measurement apparatus, unlike a configuration where the front end portions are closed by only the biasing force of a biasing member, it is possible to reliably prevent a situation where the front end portions do not completely close due to the biasing force of the biasing member being insufficient, which would make it difficult to correctly detect the detected value.

Also, in the clamp sensor according to the present invention, a flat portion, which becomes parallel with the length direction of the main body unit in a state where the front end portions of the first and second first and second clamp units are closed, is provided at the contacted portion of the second clamp unit.

By using such construction, for example, a biasing member that biases the second clamp unit in a direction where the respective front end portions of the first and second first and second clamp units open is provided, when the slide portion has been slid toward the one end portion of the main body unit to place the first and second clamp units in the closed state, it is possible for the pressing force applied to the slide portion from the flat portion of the second clamp unit due to the biasing force of the biasing member to act in a direction that is perpendicular to the sliding direction of the slide portion. That is, with the clamp sensor and the measurement apparatus, in the closed state it is possible to prevent the pressing force applied to the slide portion from the second clamp unit from acting in the sliding direction of the slide portion (or to reduce the pressing force in the sliding direction). This means that according to the clamp sensor and the measurement apparatus, even if the user lifts his/her finger away from the slide portion in the semi-locked state, it is possible to reliably prevent a situation where the slide portion would slide toward the base end portion side of the main body unit, releasing the semi-locked state.

Also, in the clamp sensor and measurement apparatus according to the present invention, the support shaft is provided closer to the other side surface than a center of the ring-shaped body.

By using such construction, compared to a configuration where the support shaft is provided closer to the other side surface than the center of the ring-shaped body, it is possible to shorten the distance between the point of action of the force applied from the slide portion onto the outer circumferential surface of the second clamp unit and the center of rotation of the second clamp unit (i.e., the position of the support shaft). This means that with the clamp sensor and the measurement apparatus, it is possible to greatly rotate the second clamp unit by sliding the slide portion by only a small amount, and as a result, it is possible to further improve the operability of an operation (closing operation) that closes the front end portions of the first and second clamp units.

It should be noted that the disclosure of the present invention relates to a content of Japanese Patent Application 2014-66402 that was filed on 27 Mar. 2014, and the entire content of which is herein incorporated by reference.

BRIEF DESCRIPTION OF THE DRAWINGS

These and other objects and features of the present invention will be explained in more detail below with reference to the attached drawings, wherein:

FIG. 1 is a block diagram showing the configuration of a current measurement apparatus;

DESCRIPTION OF THE PREFERRED EMBODIMENTS

Figure 2:
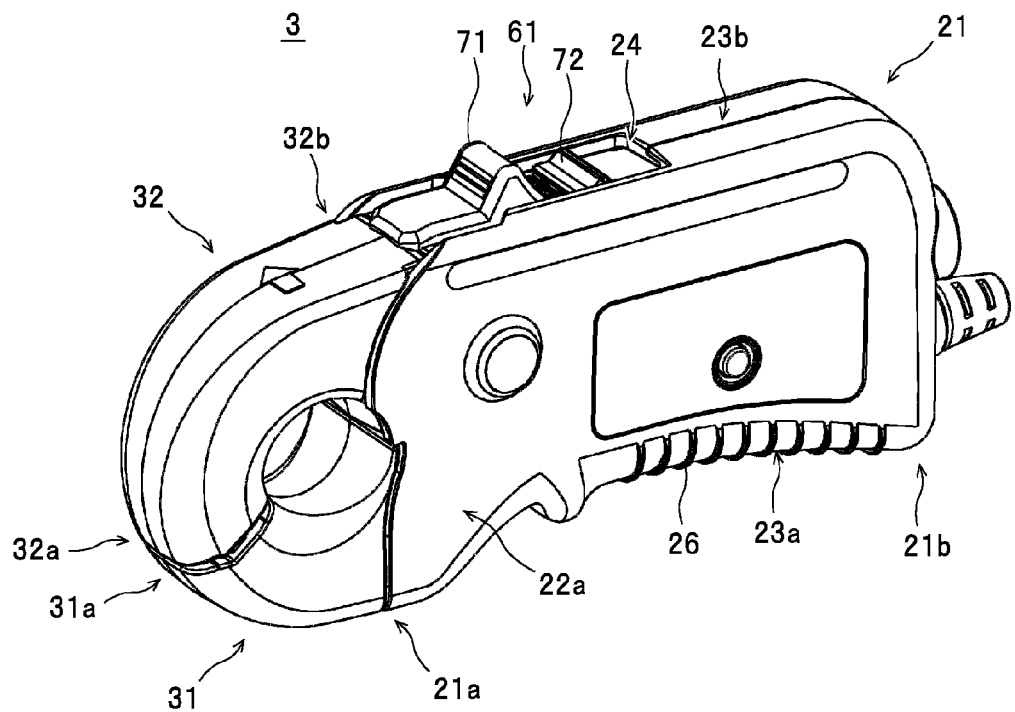
FIG. 2 is a perspective view of a clamp sensor.

Preferred embodiments of a clamp sensor and a measurement apparatus according to the present invention will now be described with reference to the enclosed drawings.

First, as an example of a measurement apparatus, the configuration of a current measurement apparatus 1 will be described with reference to the drawings. As one example, the current measurement apparatus 1 shown in FIG. 1 is constructed so as to be capable of measuring the current (one example of a "measured value") flowing on a wire 200 (see FIG. 3) that is the object to be clamped. In more detail, as shown in FIG. 1, the current measurement apparatus 1 is constructed of an apparatus main body 2 and a clamp sensor 3.

As shown in FIG. 1, the apparatus main body 2 includes a measurement unit 11, an operation unit 12, a display unit 13, and a control unit 14.

The measurement unit 11 operates in accordance with control by the control unit 14 to carry out a measurement process that measures the current flowing on the wire 200 based on magnetism (one example of a "detected value") detected by the clamp sensor 3.

The operation unit 12 includes various switches and outputs operation signals when the various switches have been operated. The display unit 13 displays a measured value of current or the like in accordance with control by the control unit 14. The control unit 14 controls the various units that construct the apparatus main body 2 in accordance with the operation signals outputted from the operation unit 12.

Figure 3:
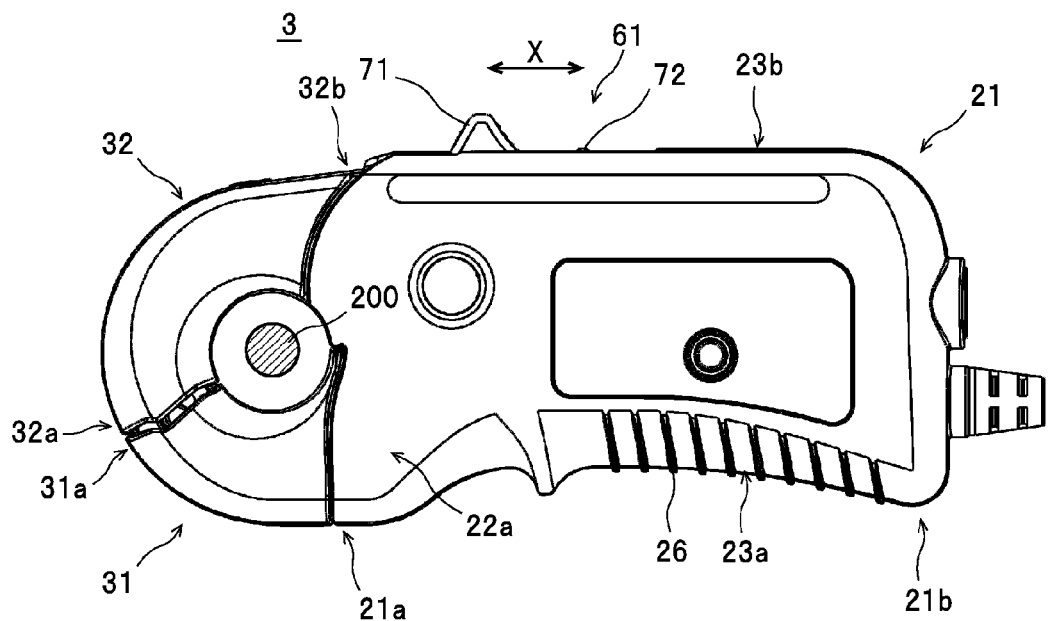
FIG. 3 is a front view of the clamp sensor.
Figure 4:
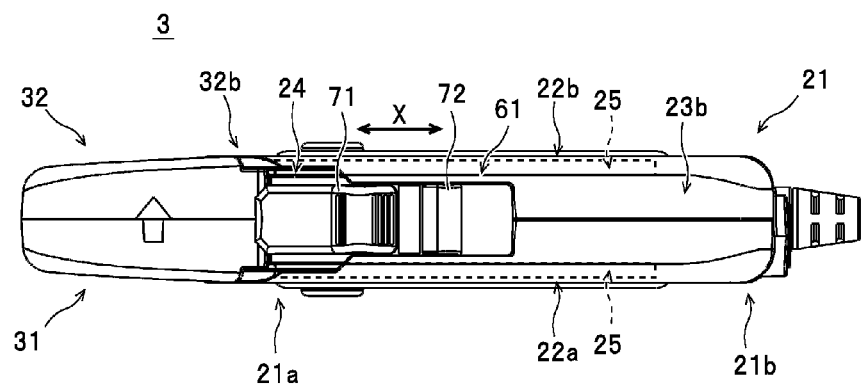
FIG. 4 is a plan view of the clamp sensor.

The clamp sensor 3 is a clamp sensor that detects magnetism as one example of a detected value in a state where the wire 200 has been clamped as an object to be clamped (i.e., the "surrounded state": see FIG. 3). As shown in FIGS. 2 to 4, the clamp sensor 3 includes a main body unit 21, a first clamp unit 31, a second clamp unit 32, and an opening/closing mechanism 61.

As shown in FIGS. 2 to 4, the main body unit 21 has a pair of main surfaces 22a, 22b (hereinafter collectively referred to as the "main surfaces 22" when no distinction is required) that are opposite each other and a pair of side surfaces 23a, 23b (hereinafter collectively referred to as the "side surfaces 23" when no distinction is required) that are opposite each other, and is formed as a box with a front end portion 21a (which corresponds to "one end portion" in the patent claims) that is open and a base end portion 21b (which corresponds to the "other end portion" in the patent claims) that is closed.

Figure 5:
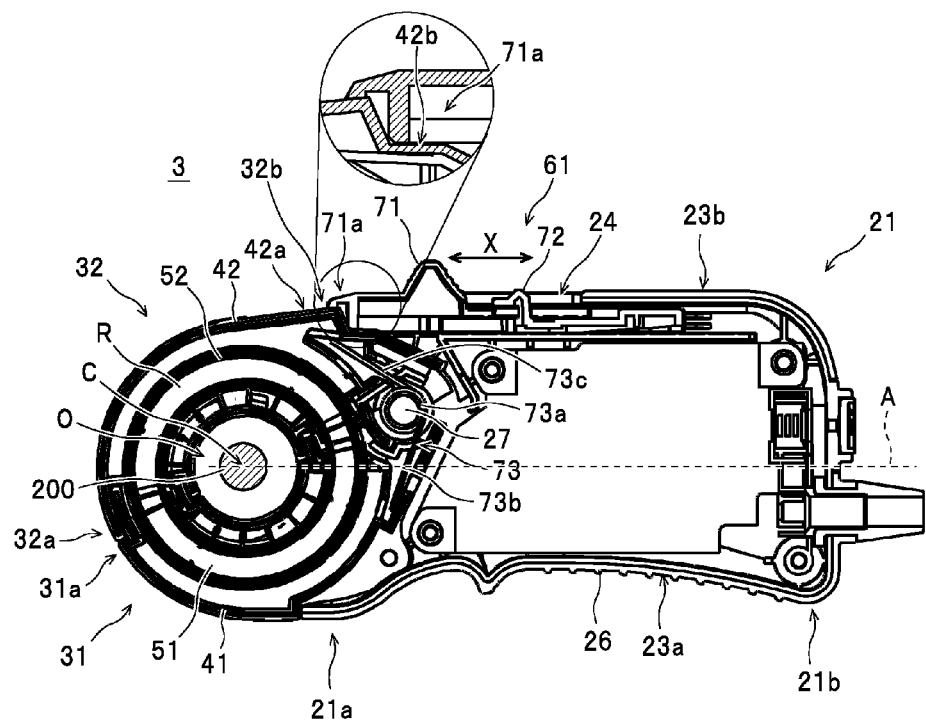
FIG. 5 is a cross-sectional view of the clamp sensor.

As shown in FIGS. 2 and 4, a cutaway 24, which exposes a first slide portion 71 and a second slide portion 72 of the opening/closing mechanism 61, described later, is formed in the side surface 23b of the main body unit 21. Also, as shown in FIG. 4, guide grooves 25 for slidably supporting the first slide portion 71 and the second slide portion 72 are formed in the main surfaces 22a, 22b in the periphery of the side surface 23b. A plurality of bar-like convex portions 26 that function as a grip are formed on the side surface 23a of the main body unit 21. As shown in FIG. 5, a support shaft 27 that supports the second clamp unit 32 is provided on the main body unit 21 so as to intersect (as one example, at right angles) the main surfaces 22a, 22b. Here, as shown in FIG. 5, the support shaft 27 is provided closer to the side surface 23b than a center C of a ring-shaped body R formed by the clamp units 31, 32 (i.e., on the side where the first slide portion 71 is disposed, which corresponds to the "other side surface out of the side surfaces" in the patent claims). More specifically, as shown in FIG. 5, the support shaft 27 is provided closer to the side surface 23b than a position on a straight line A that passes through the center C and is parallel to the side surface 23b.

Figure 6:
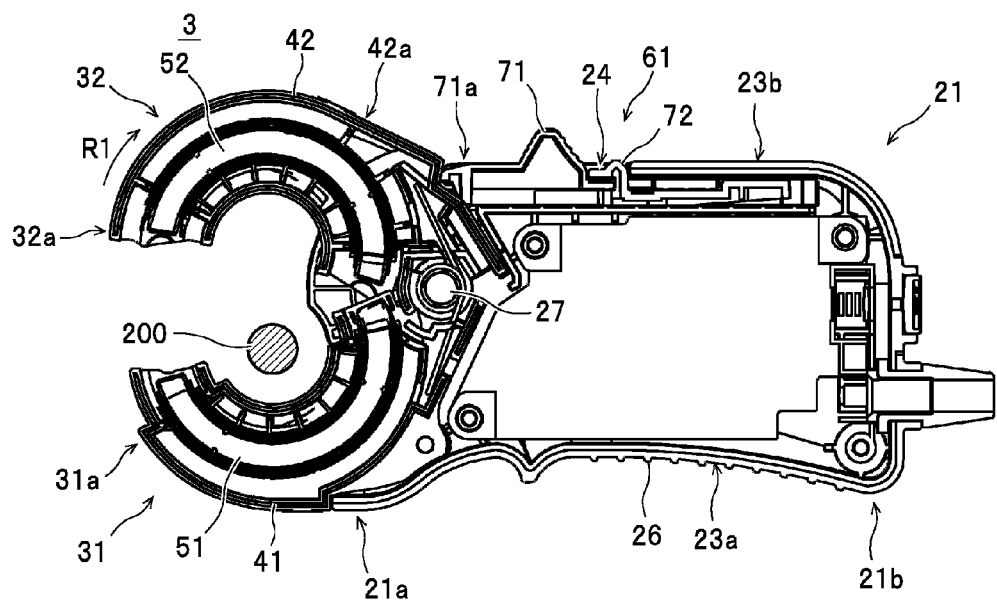
FIG. 6 is a cross-sectional view of the clamp sensor in an open state.

As shown in FIG. 5, the first clamp unit 31 includes a first case 41 and a first sensor 51. The first case 41 is formed separately to the main body unit 21. Also, as shown in FIGS. 5 and 6, the first case 41 is formed so as to be semicircular when viewed from the front and includes a housing space capable of internally housing the first sensor 51. As shown in FIGS. 5 and 6, the first sensor 51 is formed so as to be semicircular when viewed from the front and is housed in the housing space of the first case 41. Also, the first clamp unit 31 is fixed to the side surface 23a ("one side surface out of the side surfaces" in the patent claims) at the front end portion 21a of the main body unit 21 in a state where the first clamp unit 31 is incapable of moving. Here, it is possible to use either a configuration where the first case 41 of the first clamp unit 31 and the main body unit 21 are separate or a configuration where the first case 41 and the main body unit 21 are integrated.

As shown in FIG. 5, the second clamp unit 32 includes a second case 42 and a second sensor 52. As shown in FIGS. 5 and 6, the second case 42 is formed so as to be semicircular when viewed from the front and forms a housing space capable of internally housing the second sensor 52. As shown in FIGS. 5 and 6, the second sensor 52 is formed so as to be semicircular when viewed from the front and is housed in the housing space of the second case 42. Together with the first sensor 51 of the first clamp unit 31, the second sensor 52 detects magnetism as a detected value.

As shown in FIG. 5, a base end portion 32b of the second clamp unit 32 is axially supported by the support shaft 27 provided on the main body unit 21 and the second clamp unit 32 is disposed closer to the side surface 23b (i.e., "the other side surface out of the side surfaces" in the patent claims) at the front end portion 21a of the main body unit 21 so as to be capable of rotating with the support shaft 27 as the center of rotation.

As shown in FIG. 5, a flat portion 42b is provided on an outer circumferential surface 42a of the second case 42 at the base end portion 32b side of the second clamp unit 32. Here, the flat portion 42b is formed at a contacted portion which, in a state where the front end portions 31a, 32a of the clamp units 31, 32 are closed (hereinafter, this state is referred to as the "closed state"), is contacted by a front end portion 71a (see FIG. 5) of the first slide portion 71 of the opening/closing mechanism 61. Also, as shown in FIG. 5, the flat portion 42b is formed so that in the closed state, the flat portion 42b is parallel with the length direction of the main body unit 21 that joins the base end portion 21b and the front end portion 21a of the main body unit 21 (i.e., the sliding direction of the first slide portion 71: the direction of the arrow X shown in FIGS. 3 to 5).

In this clamp sensor 3, by constructing the clamp units 31, 32 in this way, it is possible to open and close the respective front end portions 31a, 32a of the first clamp unit 31 and the second clamp unit 32. With this clamp sensor 3, a ring-shaped body R (see FIG. 5) that surrounds the wire 200 to be clamped is formed by the clamp units 31, 32 in the closed state. Here, with the clamp sensor 3, the clamp units 31, 32 are disposed on the main body unit 21 so that the plane of the opening 0 (see FIG. 5) of the ring-shaped body R formed by the clamp units 31, 32 is parallel to the main surfaces 22a, 22b of the main body unit 21.

The opening/closing mechanism 61 is a mechanism for opening and closing the front end portions 31a, 32a of the clamp units 31, 32 and as shown in FIGS. 2 to 5 includes the first slide portion 71, the second slide portion 72, and a spring 73 (see FIG. 5).

The first slide portion 71 is slidably disposed on the side surface 23b (i.e., "the other side surface" in the patent claims) of the main body unit 21. More specifically, side portions of the first slide portion 71 fit into the guide grooves 25 (see FIG. 4) formed in the main surfaces 22a, 22b in the vicinity of the side surface 23b, which makes it possible for the first slide portion 71 to slide along the length direction of the main body unit 21 that joins the base end portion 21b and the front end portion 21a of the main body unit 21 (i.e., the direction of the arrow X shown in FIGS. 3 to 5). This first slide portion 71 is used when opening and closing the front end portions 31a, 32a of the clamp units 31, 32. More specifically, when the first slide portion 71 is slid toward the front end portion 21a side of the main body unit 21 (i.e., in the direction of the arrow X1 shown in FIG. 7), the front end portion 71a of the first slide portion 71 will contact the outer circumferential surface 42a of the second case 42 of the second clamp unit 32 so that the second clamp unit 32 rotates in a direction where the front end portions 31a, 32a of the clamp units 31, 32 close (i.e., in the direction of the arrow R2 shown in FIG. 7), producing a state where the front end portions 31a, 32a are closed (the "closed state"). Also, when the first slide portion 71 is slid toward the base end portion 21b of the main body unit 21 (i.e., in the direction of the arrow X2 shown in FIG. 7), the contact of the front end portion 71a on the outer circumferential surface 42a of the second case 42 will be released, and due to the biasing force of the spring 73, the second clamp unit 32 will rotate in a direction where the front end portions 31a, 32a of the clamp units 31, 32 open (i.e., in the direction of the arrow R1 shown in FIG. 6), producing a state where the front end portions 31a, 32a are open (see FIG. 7: hereinafter this state is referred to as the "open state").

The second slide portion 72 is constructed so as to be capable of fitting into the first slide portion 71 and is capable of sliding relative to the first slide portion 71 along the length direction of the main body unit 21 (i.e., the sliding direction of the first slide portion 71). The second slide portion 72 functions so as to restrict the first slide portion 71 sliding relative to the main body unit 21. More specifically, when positioned toward the front end portion 21a of the main body unit 21 (the state shown in FIGS. 6 and 7), the second slide portion 72 permits the first slide portion 71 to slide, but when positioned toward the base end portion 21b of the main body unit 21 (the state shown in FIG. 5), the second slide portion 72 restricts sliding of the front end portion 71a.

The spring 73 is one example of a "biasing member" and biases the second clamp unit 32 in a direction where the front end portions 31a, 32a of the clamp units 31, 32 open. Here, as one example, the spring 73 is constructed of a torsion coil spring (torsion spring). As shown in FIG. 5, a coil portion 73a of the spring 73 is supported by the support shaft 27, one arm portion 73b engages the main body unit 21, and another arm portion 73c engages the base end portion 32b of the second clamp unit 32.

Next, the method of using the current measurement apparatus 1 will be described with reference to the drawings.

First, the operation unit 12 of the apparatus main body 2 is operated to turn the power on and then the wire 200 that is to be clamped is clamped by the clamp units 31, 32 of the clamp sensor 3. More specifically, the user grasps the main body unit 21 of the clamp sensor 3 in the open state (see FIG. 6) and moves the clamp units 31, 32 close to the wire 200.

Here, as shown in FIG. 6, with the clamp sensor 3 in the open state, the first slide portion 71 and the second slide portion 72 of the opening/closing mechanism 61 are both positioned toward the base end portion 21b of the main body unit 21, producing the open state where the front end portions 31a, 32a of the clamp units 31, 32 are open due to the biasing force of the spring 73 of the opening/closing mechanism 61 (i.e., a state where the second clamp unit 32 has rotated in the direction of the arrow R1 shown in FIG. 6).

After this, the wire 200 is passed through the gap between the front end portions 31a, 32a of the clamp units 31, 32 and as shown in FIG. 6, the clamp sensor 3 is moved so that the wire 200 becomes positioned in the space surrounded by the clamp units 31, 32 that face one another.

Figure 7:
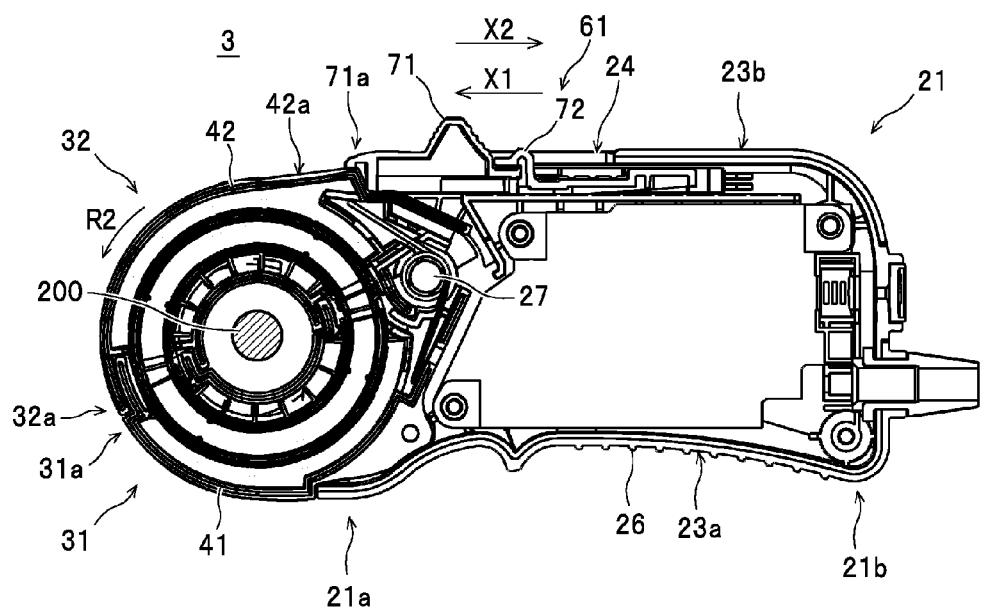
FIG. 7 is a cross-sectional view of the clamp sensor in a closed state.

After this, as shown in FIG. 7, the user slides the first slide portion 71 and the second slide portion 72 along the length direction of the main body unit 21 in the direction of the front end portion 21a side of the main body unit 21 (i.e., in the direction of the arrow X1 shown in FIG. 7). When doing so, the front end portion 71a of the first slide portion 71 contacts the outer circumferential surface 42a of the second case 42 of the second clamp unit 32 so that the second clamp unit 32 rotates in a direction where the front end portions 31a, 32a of the clamp units 31, 32 close (i.e., in the direction of the arrow R2 shown in FIG. 7).

Here, with the clamp sensor 3, the first clamp unit 31 is fixed to the front end portion 21a of the main body unit 21 and the second clamp unit 32 is rotatably disposed on the front end portion 21a of the main body unit 21. When the first slide portion 71 has been slid toward the front end portion 21a of the main body unit 21, the front end portion 71a of the first slide portion 71 contacts the outer circumferential surface 42a of the second clamp unit 32, so that the second clamp unit 32 rotates in a direction where the front end portions 31a, 32a of the clamp units 31, 32 close. This means that with the clamp sensor 3, it is possible to carry out an operation that closes the front end portions 31a, 32a of the clamp units 31, 32 (hereinafter, this operation is also referred to as the "closing operation") in a state where the clamp units 31, 32 do not move relative to the main body unit 21 (here meaning movement along the length direction of the main body unit 21). Accordingly, the clamp sensor 3 differs to a construction where the clamp units move relative to the main body unit 21 as part of a closing operation, and since it is not necessary to carry out an operation of adjusting the position of the clamp sensor 3 (i.e., an operation of moving the clamp sensor 3) relative to the wire 200 to prevent the wire 200 from coming out of the clamp units 31, 32 when a closing operation is carried out, it is possible to make a corresponding improvement in operability.

Also, with the clamp sensor 3, by providing the support shaft 27 closer to the side surface 23b than the center C of the ring-shaped body R formed by the clamp units 31, 32, compared to a configuration where the support shaft 27 is provided closer to the side surface 23a than the center C of the ring-shaped body R, it is possible to shorten the distance between the point of action of the force applied from the first slide portion 71 onto the outer circumferential surface 42a of the second clamp unit 32 and the center of rotation of the second clamp unit 32 (i.e., the position of the support shaft 27). This means that with the clamp sensor 3, it is possible to greatly rotate the second clamp unit 32 by sliding the first slide portion 71 by only a small amount.

Next, as shown in FIG. 7, the first slide portion 71 is slid until the front end portions 31a, 32a of the clamp units 31, 32 are closed (i.e., contact one another). Here, with the clamp sensor 3, the force that causes the first slide portion 71 to slide acts upon the outer circumferential surface 42a of the second clamp unit 32 to rotate the second clamp unit 32, which places the clamp units 31, 32 in the closed state. This means that with the clamp sensor 3, unlike a configuration where the biasing force of a spring acts in the direction in which the front end portions 31a, 32a close and the front end portions 31a, 32a close due to such biasing force of the spring alone, it is possible to avoid a situation where the closing of the front end portions 31a, 32a is incomplete due to the biasing force of the spring being insufficient and therefore possible to reliably close the front end portions 31a, 32a.

After this, when the front end portions 31a, 32a of the clamp units 31, 32 have been closed, an engaged portion, not shown, of the first slide portion 71 engages an engaged portion, not shown, formed on the side surface 23b of the main body unit 21, producing a semi-locked state where sliding of the first slide portion 71 in a direction toward the base end portion 21b of the main body unit 21 (i.e., in the direction of the arrow X2 shown in FIG. 7) is restricted (provisionally restricted).

Here, when the clamp sensor 3 is in the closed state, the flat portion 42b that is parallel with the length direction of the main body unit 21 (i.e., the sliding direction of the first slide portion 71) and the front end portion 71a are in contact (see FIG. 5). This means that when the clamp sensor 3 is in the closed state, the pressing force that acts on the front end portion 71a of the first slide portion 71 from the flat portion 42b of the second clamp unit 32 due to the biasing force of the spring 73 will act in a direction that is perpendicular (or a direction that is substantially perpendicular) to the sliding direction of the first slide portion 71. That is, it is possible to eliminate (or reduce) the pressing force from the second clamp unit 32 that acts in the sliding direction of the first slide portion 71 (i.e., in the direction of the arrow X2 shown in FIG. 7). Accordingly, with the clamp sensor 3, even if the user lifts his/her finger away from the first slide portion 71 in the semi-locked state, it is possible to reliably prevent a situation where the first slide portion 71 would slide toward the base end portion 21b side of the main body unit 21, releasing the semi-locked state.

Next, while the semi-locked state of the first slide portion 71 is maintained, the second slide portion 72 is moved toward the base end portion 21b side (i.e., in the direction of the arrow X2 shown in FIG. 7). By doing so, the first slide portion 71 is placed in a fully locked state where sliding from the semi-locked state in the direction of the arrow X2 is reliably restricted.

By carrying out the above process, the clamping of the wire 200 is completed. Next, the clamp units 31, 32 (the first sensor 51 and the second sensor 52) of the clamp sensor 3 detect magnetism produced by the current flowing on the wire 200 and output a detection signal.

After this, the operation unit 12 is operated to designate the start of measurement. When doing so, the control unit 14 controls the measurement unit 11 to carry out the measurement process. In this measurement process, the measurement unit 11 measures the current flowing on the wire 200 (i.e., the measured value for the clamped object) based on the detection signal outputted from the clamp sensor 3 (i.e., magnetism as the detected value detected by the clamp sensor 3). Next, the control unit 14 controls the display unit 13 to display the value of the current measured by the measurement unit 11. By doing so, measurement of the current flowing on the wire 200 is completed.

On the other hand, when measurement is completed, to release the clamping of the wire 200, the second slide portion 72 is slid toward the front end portion 21a side of the main body unit 21 (i.e., toward the front end portion 71a of the first slide portion 71) to release the state (the "locked state") where sliding of the first slide portion 71 is not possible. After this, the first slide portion 71 is slid together with the second slide portion 72 toward the base end portion 21b side of the main body unit 21. At such time, the front end portion 71a of the first slide portion 71 that was in contact with the outer circumferential surface 42a of the second case 42 becomes separated from the outer circumferential surface 42a. At this time, due to the biasing force of the spring 73, the second clamp unit 32 rotates in a direction where the front end portions 31a, 32a of the clamp units 31, 32 move apart (i.e., in the direction of the arrow R1 shown in FIG. 6) and by doing so, the clamp units 31, 32 are placed in the open state shown in FIG. 6. After this, the clamp sensor 3 (the clamp units 31, 32) is moved away from the wire 200 so that the wire 200 passes out from the gap between the front end portions 31a, 32a of the clamp units 31, 32. By doing so, measurement of the current flowing on the wire 200 is completed.

In this way, with the clamp sensor 3 and the current measurement apparatus 1, the first clamp unit 31 is fixed to the front end portion 21a of the main body unit 21 and the second clamp unit 32 is rotatably disposed on the front end portion 21a of the main body unit 21, and when the first slide portion 71 has been slid toward the front end portion 21a of the main body unit 21, the front end portion 71a of the first slide portion 71 contacts the outer circumferential surface 42a of the second clamp unit 32 to rotate the second clamp unit 32 in a direction where the front end portions 31a, 32a of the clamp units 31, 32 close. This means that with the clamp sensor 3 and the current measurement apparatus 1, since it is possible to carry out a closing operation in a state where the clamp units 31, 32 do not move relative to the main body unit 21, unlike a conventional configuration where the clamp units 31, 32 move relative to the main body unit 21 as part of a closing operation, when carrying out a closing operation, it is not necessary to carry out an operation such as adjusting the position of the clamp sensor 3 relative to the wire 200 to prevent the wire 200 from coming out from the clamp units 31, 32, resulting in a sufficient improvement in operability. Also, with the clamp sensor 3 and the current measurement apparatus 1, the force that slides the first slide portion 71 acts upon the outer circumferential surface 42a of the second clamp unit 32 to rotate the second clamp unit 32, and by doing so it is possible to place the clamp units 31, 32 in the closed state. This means that with the clamp sensor 3 and the current measurement apparatus 1, unlike a configuration where the front end portions 31a, 32a are closed by only the biasing force of a spring, it is possible to reliably prevent a situation where the front end portions 31a, 32a do not completely close due to the biasing force of the spring being insufficient, which would make it difficult to correctly detect the detected value.

Also, with the clamp sensor 3 and the current measurement apparatus 1, the flat portion 42b, which is parallel to the length direction of the main body unit 21 (i.e., the sliding direction of the first slide portion 71) in the closed state, is provided at the engaged portion of the outer circumferential surface 42a of the second clamp unit 32. This means that according to the clamp sensor 3 and the current measurement apparatus 1, when the first slide portion 71 has been slid toward the front end portion 21a of the main body unit 21 to place the clamp units 31, 32 in the closed state, it is possible for the pressing force applied to the front end portion 71a of the first slide portion 71 from the flat portion 42b of the second clamp unit 32 due to the biasing force of the spring 73 to act in a direction that is perpendicular to the sliding direction of the first slide portion 71. That is, with the clamp sensor 3 and the current measurement apparatus 1, in the closed state it is possible to prevent the pressing force applied to the first slide portion 71 from the second clamp unit 32 from acting in the sliding direction of the first slide portion 71 (or to reduce the pressing force in the sliding direction). This means that according to the clamp sensor 3 and the current measurement apparatus 1, even if the user lifts his/her finger away from the first slide portion 71 in the semi-locked state, it is possible to reliably prevent a situation where the first slide portion 71 would slide toward the base end portion 21b side of the main body unit 21, releasing the semi-locked state.

Also, according to the clamp sensor 3 and the current measurement apparatus 1, by providing the support shaft 27 closer to the side surface 23b than the center C of the ring-shaped body R formed by the clamp units 31, 32, compared to a configuration where the support shaft 27 is provided closer to the side surface 23a than the center C, it is possible to shorten the distance between the point of action of the force applied from the first slide portion 71 onto the outer circumferential surface 42a of the second clamp unit 32 and the center of rotation of the second clamp unit 32 (i.e., the position of the support shaft 27). This means that with the clamp sensor 3 and the current measurement apparatus 1, it is possible to greatly rotate the second clamp unit 32 by sliding the first slide portion 71 by only a small amount, and as a result, it is possible to further improve the operability of an operation (closing operation) that closes the front end portions 31a, 32a of the clamp units 31, 32.

Note that the configurations of the clamp sensor and the measurement apparatus according to the present invention are not limited to the configurations described above. As one example, although the clamp sensor 3 that detects magnetism as the detected value has been described above as an example, the detected value is not limited to magnetism. As one example, it is also possible to adapt the present invention to a clamp sensor that has a water pipe, a gas pipe, or the like as the clamped object and detects the flow rate and temperature of water flowing in the water pipe and the flow rate and temperature of the gas flowing in the gas pipe as measured values.

Also, although the current measurement apparatus 1 that measures current as one example of the measured value based on the detected value (in the above example, magnetism) detected by the clamp sensor 3 has been described above as an example, it is also possible to adapt the present invention to a measurement apparatus that measures various measured values aside from current based on magnetism or the various detected values aside from magnetism given above.

Also, although an example equipped with the first slide portion 71 and the second slide portion 72 that restricts the sliding of the first slide portion 71 has been described above, it is also possible to adapt the present invention to a configuration that is not equipped with the second slide portion 72.

Although an example where the flat portion 42b that becomes parallel with the length direction of the main body unit 21 in the closed state is formed at the contacted portion of the outer circumferential surface 42a of the second clamp unit 32 has been described above, it is also possible to apply the present invention to a configuration where such flat portion 42b is not formed on the outer circumferential surface 42a.

Although an example where the support shaft 27 is provided closer to the side surface 23a than a center position between the side surfaces 23a, 23b of the main body unit 21 has been described above, it is also possible to apply the present invention to a configuration where the support shaft 27 is provided at such center position and a configuration where the support shaft 27 is provided closer to the side surface 23b than the center position.

Although an example configuration where the spring 73 composed of a torsion coil spring is used as the biasing member has been described above, it is also possible to apply the present invention to a configuration where a coil spring is used as the biasing member and the second clamp unit 32 is biased in a direction where the front end portions 31a, 32a of the clamp units 31, 32 open.

What is claimed is:

1. A clamp sensor comprising:
  a main body unit having a pair of main surfaces that oppose one another and a pair of side surfaces that oppose one another;
  a first clamp unit and a second clamp unit which are constructed so that respective front end portions thereof are capable of opening and closing, which form, in a state where the front end portions are closed, a ring-shaped body that surrounds an object to be clamped, and which are provided at one end portion of the main body unit so that a plane of an opening of the ring-shaped body is parallel to the respective main surfaces; and an opening/closing mechanism that opens and closes the respective front end portions of the first and second clamp units, wherein the clamp sensor is configured so as to be capable of detecting a detected value for the object to be clamped, the first clamp unit is fixed at the one end portion of the main body unit on a side of one side surface out of the side surfaces, the second clamp unit has a base end portion axially supported by a support shaft provided so as to intersect the respective main surfaces and is rotatably disposed at the one end portion of the main body unit on a side of other side surface out of the side surfaces with the support shaft as a center of rotation, and the opening/closing mechanism includes:

a biasing member that biases the second clamp unit in a direction where the respective front end portions of the first and second clamp units open; and a sliding portion which is disposed on a side of the other side surface so as to be capable of sliding along a length direction of the main body unit that joins the other end portion and the one end portion of the main body unit and which contacts, when slid toward the one end portion of the main body unit, a contacted portion of an outer circumferential surface of the second clamp unit to rotate the second clamp unit in a direction where the respective front end portions of the first and second clamp units close.

2. The clamp sensor according to claim 1,
wherein a flat portion, which becomes parallel with the length direction of the main body unit in a state where the front end portions of the first and second clamp units are closed, is provided at the contacted portion of the second clamp unit.

3. The clamp sensor according to claim 1,
wherein the support shaft is provided closer to the other side surface than a center of the ring-shaped body.

4. The clamp sensor according to claim 2,
wherein the support shaft is provided closer to the other side surface than a center of the ring-shaped body.

5. A measurement apparatus comprising:
the clamp sensor according to claim 1; and
a measurement unit measuring a measured value for the object to be clamped based on the detected value detected by the clamp sensor.

6. A measurement apparatus comprising:
the clamp sensor according to claim 2; and
a measurement unit measuring a measured value for the object to be clamped based on the detected value detected by the clamp sensor.

7. A measurement apparatus comprising:
the clamp sensor according to claim 3; and
a measurement unit measuring a measured value for the object to be clamped based on the detected value detected by the clamp sensor.

8. A measurement apparatus comprising:
the clamp sensor according to claim 4; and
a measurement unit measuring a measured value for the object to be clamped based on the detected value detected by the clamp sensor.

* * * * *